United States Patent [19]

Miyahara et al.

[11] Patent Number: 5,057,457
[45] Date of Patent: Oct. 15, 1991

[54] MULTIMOLD SEMICONDUCTOR DEVICE AND THE MANUFACTURING METHOD THEREFOR

[75] Inventors: Syouichi Miyahara; Keiji Kamasaki, both of Yokohama; Michiya Higashi, Kawasaki, all of Japan

[73] Assignee: Kabushiki Kaisha Toshiba, Kawasaki, Japan

[21] Appl. No.: 580,542

[22] Filed: Sep. 11, 1990

[30] Foreign Application Priority Data

Sep. 13, 1989 [JP] Japan .................. 1-237578

[51] Int. Cl.$^5$ .............. H01L 21/48; H01L 21/56
[52] U.S. Cl. ............................. 437/207; 437/211; 357/72
[58] Field of Search .......... 357/72, 74; 437/217, 437/218, 219, 927, 206, 207, 211, 220; 174/52.4; 264/272.17

[56] References Cited

U.S. PATENT DOCUMENTS 3,762,039 10/1973 Douglass et al. .............. 437/217
4,250,347 2/1981 Fierkens ..................... 437/217

FOREIGN PATENT DOCUMENTS 55-154755 12/1980 Japan ...................... 357/72
61-84041  4/1986 Japan ...................... 357/72
62-79654  4/1987 Japan ...................... 357/72
62-86747  4/1987 Japan ...................... 357/72
1-44052   2/1989 Japan ...................... 357/72

Primary Examiner—Rolf Hille
Assistant Examiner—S. V. Clark
Attorney, Agent, or Firm—Foley & Lardner

[57] ABSTRACT

In multimold semiconductor devices, semiconductor chips are mounted on a lead frame and bonded with wire, sealed by an inner resin, and further enclosed by an outer resin. In particular, wax to be added to the inner resin is at least one compound selected from the group consisting of ester group, fatty acid based, fatty acid metallic salt based, fatty alcohol, polyhydric alcohol, and fatty acid amide compounds. In the semiconductor devices sealed by the inner resin including wax thus defined, since the adhesion strength between the inner and outer resins can be increased, peeling resistance between the two and the moisture resistance can be improved markedly and cracks after dip soldering can be perfectly eliminated, without effecting any conventional inner resin treatment such as honing, burning, after-curing, etc.

1 Claim, 3 Drawing Sheets

MULTIMOLD SEMICONDUCTOR DEVICE AND THE MANUFACTURING METHOD THEREFOR

BACKGROUND OF THE INVENTION

The present invention relates to a multimold semiconductor device and the manufacturing method therefor.

Recently, multimold semiconductor devices molded by two or more resin layers of different characteristics have been widely used. One of the most typical multimold semiconductor devices is a double mold photocoupler.

The multimold photocoupler devices as described above have been so far manufactured in accordance with the following process: first, semiconductor chips including light-emitting elements and light-receiving elements are mounted on a lead frame and then wires are bonded thereon. Thereafter, the semiconductor chips are arranged in cavities of an inner resin mold and an inner resin is injected into the inner resin mold. The chips sealed by the hardened inner resin are removed from the inner resin mold. In this process, wax serving as a mold releasing agent or mold lubricant is added to the inner resin prepared in the form of tablet, so that the hardened inner resin sealed chip can be easily removed from the mold. The principal component of the conventional wax added to the inner resin is hydrocarbon. The characteristics of the conventional wax are as follows: (1) the external activity is high and the exudation rate to resin surface is high; (2) the molding point is relatively high beyond 100° C.; (3) the viscosity at higher temperature is high; (4) the polarity is small and the compatibility with another wax composed of other components is inferior; (5) the oxidization rate in air is high and therefore the brittleness due to oxidation is large. Therefore, when wax including hydrocarbon as the principal component is added to the inner resin, there exists a problem in that a high viscosity wax layer is easily formed on the outer surface of the inner resin. Since an outer resin is formed on the inner resin so as to enclose the inner resin, when wax remains on the outer surface of the inner resin, the wax on the inner resin is difficult to flow and move during the outer resin forming process and further, the conformability with the wax added to the outer resin is low, thus raising various problems in that the adhesion strength at the boundary between the inner and outer resins is low and therefore the peeling strength is also low. Additionally the moisture resistance and the heat releasability are deteriorated.

To overcome these problems, inner resin treating process has been so far indispensable. The inner resin treating process includes a honing process for polishing the inner resin surface, a burning process for removing the wax exuded on the inner resin surface by burning, after-curing process for stabilizing the bridge formation reaction of the inner resin, etc. The semiconductor chips sealed by the inner resin thus treated are arranged in cavities formed in an outer resin mold; an outer resin is injected thereinto; and the chips enclosed by hardened outer resin are removed from the mold. However, the inner resin treating process results in an increase in the cost and a decrease in the yield.

In connection with this, in the case of simple-shaped double mold devices, since a single and simple inner resin treating process may be sufficient, there exists no serious problem. However, in the case of multimold (three or more mold) devices, the inner resin treatment process is rather complicated and therefore costly. Therefore, there exists a strong request to eliminate the inner resin treating process. However, it has been extremely difficult to prevent the boundary between the inner and outer resins from being peeled or separated without inner resin treatment.

Furthermore, when the inner resin treatment is not effected, there exists another problem in that the moisture resistance is low in addition to low peeling resistance. This is because since the adhesion strength between the inner and outer resins is low, moisture in air easily permeates into inside the chip inside through between the lead frame and the outer resin and then between the lead frame and the inner resin. Further, the low adhesion strength between the inner and outer resins causes heat generated by the semiconductor chip not to effectively conduct from the inner resin to the outer resin, so that the heat is not well radiated from the chip to air. The above-mentioned various problems result from the low adhesion strength between the inner and outer resins, and therefore it has been so far difficult to improve the adhesion strength between the two resins, without inner resin treatment.

SUMMARY OF THE INVENTION

With these problems in mind, therefore, it is the object of the present invention to provide a multimold semiconductor device and the manufacturing method therefore, which can increase the adhesion strength between the two resins to improve peeling resistance, moisture resistance and heat releasability, without effecting the inner resin treatment process such as honing, burning, etc.

According to the present invention, the principal component of the wax to be added to the inner resin is at least one compound selected from the group consisting of ester group, fatty acid based, fatty acid metallic salt based, polyhydric alcohol, and fatty acid amide compounds. The wax having at least one of these compounds as the principal component is all low in external activity and exudation rate to resin surface. Furthermore, in case the above wax exudates to the resin surface and forms a wax layer, since the melting point thereof is relatively as low as 100° C. or less and additionally the viscosity at high temperature is low, the wax which forms a wax layer on the inner resin is easy to flow and move when forming the outer resin. Furthermore, since the polarity thereof is relatively large, the above wax is easy to be compatible with another wax layer added to the outer resin. Furthermore, the above wax is difficult to oxidize in air and is not allowed to be brittle due to oxidation. Therefore, the adhesion strength at the boundary between the inner and outer resins is high, thus effectively preventing peeling or separation between the two resins and improving the moisture resistance and heat releasability from the two resins. As a result, since it is possible to eliminate the inner resin treating process such as honing, burning, etc., the manufacturing cost can be reduced, the yield can be increased, and the device reliability can be improved markedly.

DETAILED DESCRIPTION OF THE PREFERRED EMBODIMENTS

Figure 1:
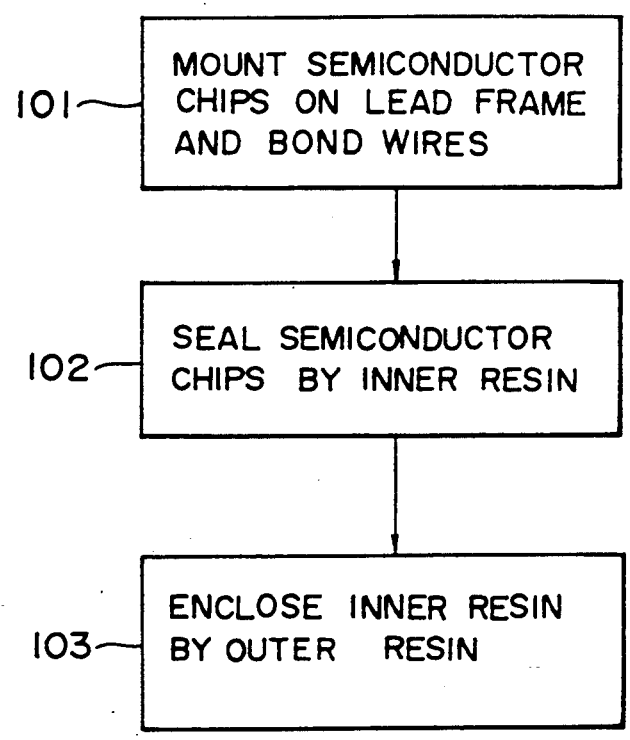
FIG. 1 is a flowchart for assistance in explaining the method of manufacturing the multimold semiconductor device according to the present invention.

FIG. 1 shows the steps of manufacturing the semiconductor chip according to the present invention. Semiconductor chips are mounted on a lead frame and wires are bonded to the chips (in step 101). The semiconductor chips are arranged in cavities formed in an inner resin mold, a melted inner resin is injected into the mold, and the chips are removed from the mold after the inner resin has hardened (in step 102). Here, the wax added to the inner resin includes as the principal component at least one compound selected from the group consisting of ester group compound, fatty acid based compound, fatty acid metallic salt based compound, fatty alcohol compound, polyhydric alcohol compound and fatty acid amide compound. The semiconductor chips sealed by the inner resin as described above are arranged in cavities in an outer resin mold and a melted outer resin is injected into the mold without effecting any inner resin treatment, and the chips are removed from the mold after the outer resin have been hardened (in step 103). Furthermore, in step 103, the inner resin is deburred or deflashed, when necessary, before being arranged in the outer resin mold. The above-mentioned inner resin is previously prepared in the form of a tablet mixed with filler and wax.

The wax added to the inner resin according to the present invention includes as the principal component at least one of ester group compound, fatty acid based compound, fatty acid metallic salt based compound, fatty alcohol compound, polyhydric alcohol compound, and fatty acid amide compound, which is each provided with the following features: (1) the external activity is low and the wax is not easily exudated to the resin surface; (2) the melting point is lower than 100° C.; (3) the viscosity at high temperature is low; (4) the polarity is large and therefore the compatibility with wax composed of other components is excellent; and (5) the oxidization rate in air is low. Therefore, when the wax including such a compound as described above as the principal component is added to the inner resin, there exists various advantages such that a wax layer is not easily formed on the inner resin surface; if formed, the wax is easily removed because of its low viscosity and good compatibility with another wax added to the outer resin; therefore the inner resin can be strongly adhered to the outer resin; the outer resin is not easily peeled from the inner resin; thus the moisture resistance and the heat releasability can be improved markedly.

FIGS. 2 to 6 show some examples of multimold semiconductor devices to which the present invention is applicable.

Figure 2:
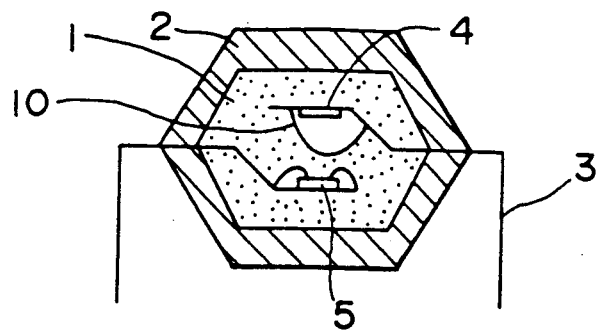
FIGS. 2 to 6 are longitudinal cross-sectional views showing some cross-sectional structures of devices to which the method of the present invention can be applied, by way of example.

FIG. 2 is a cross-sectional view showing an example of double mold photocoupler, in which a pair of opposing light emitting and receiving elements 4 and 5 are mounted on a lead frame 3 and further connected by bonding wires. The light emitting element 4 is covered by a transparent potting resin 10. The light emitting and receiving elements 4 and 5 are sealed by a white inner resin 1 and further the inner resin 1 is enclosed by a black outer resin 2. In general, the inner resin is light-transmissible epoxy resin, and the outer resin is light-shadable epoxy resin.

Figure 3:
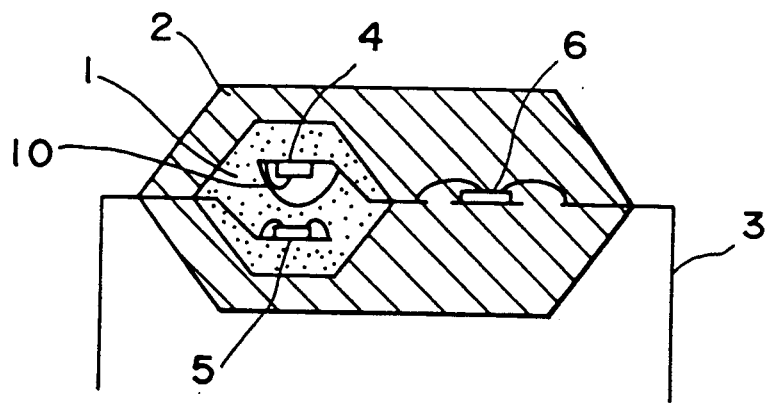
Figure 4:
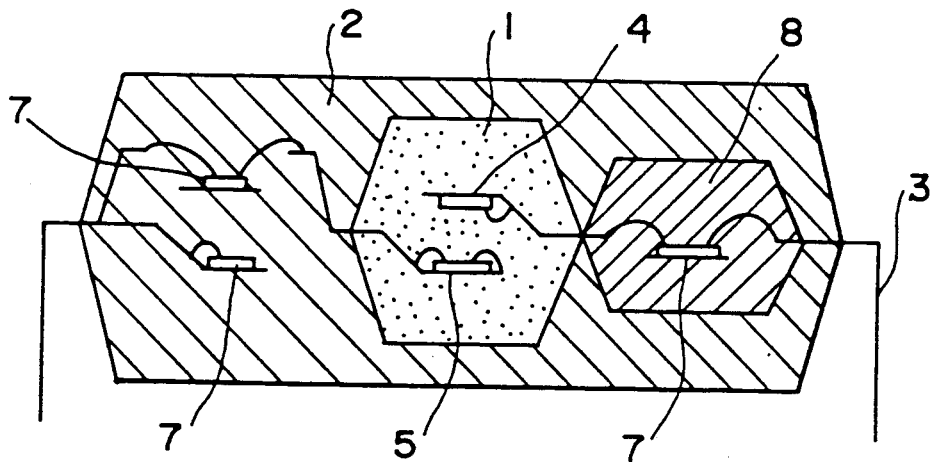
Figure 5:
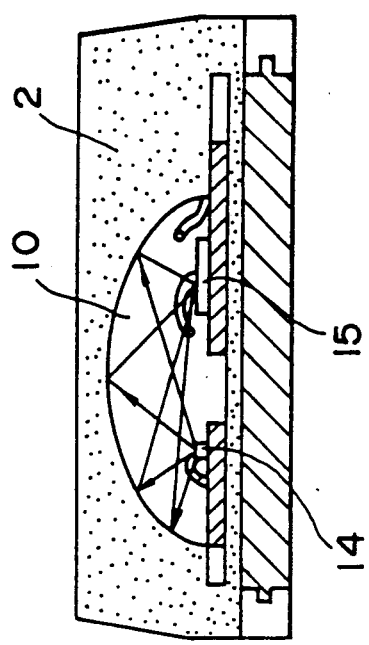
Figure 6:
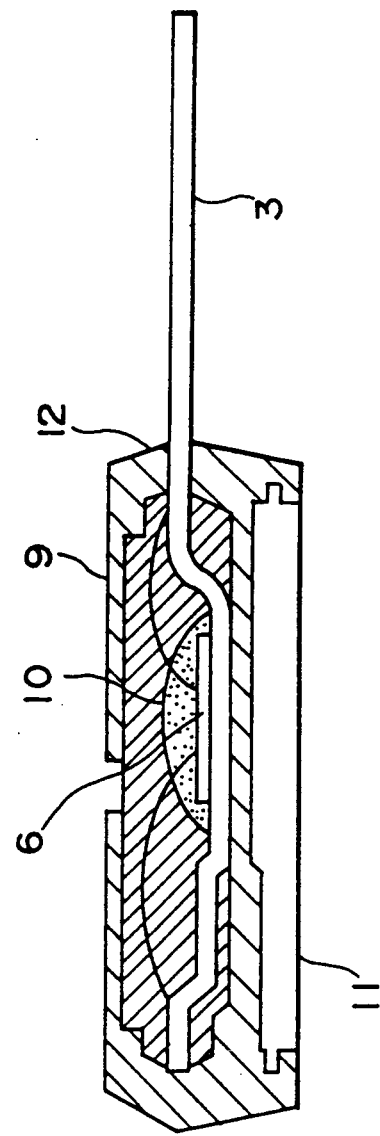

FIG. 3 shows a composite multichip (MCP) composed of the photocoupler and a bipolar IC 6 (or MOSIC); FIG. 4 shows a device in which semiconductor chips 7 are sealed by a low-thermal-stress resin 8; FIG. 5 shows a solid state optical relay (SSOR); in which a pair of light emitting and receiving elements 14 and 15 are sealed by a transparent resin and further enclosed by an outer resin 2; and FIG. 6 shows a device including a large-current control element 6, in which the inner resin 9 and the outer resin 12 are formed in two different steps to construct a heat sink 11.

EXAMPLES

Semiconductor devices were made by sealing chips with inner epoxy resins to which wax including as the principal component any one of ester group compound, fatty acid based compound, fatty acid metallic salt based compound, fatty alcohol compound, polyhydric alcohol compound and fatty acid amide compound was added, respectively. The sealed chips were further enclosed by an outer resin without any inner resin treatment process such as honing, burning, after-curing, etc. Both the inner and outer resins were formed under molding conditions such that the mold temperature was from 150° to 200° C. and the molding time was from 20 to 360 sec.

COMPARATIVE EXAMPLE 1

Chips were sealed with an inner epoxy resin to which wax including hydrocarbon as the principal component was added. The sealed chips were further enclosed by an outer resin after inner resin treatment process such as honing and after-curing. The molding conditions were the same as in Examples.

COMPARATIVE EXAMPLE 2

Chips were sealed with an inner epoxy resin to which wax including hydrocarbon as the principal component was added in the same way as in Comparative example 1. The sealed chips were further enclosed by an outer resin without any inner resin treatment process as in Examples. The molding conditions were the same as in Examples or Comparative example 1.

To verify the effect of the present invention, tests were made by preparing 100 pieces of each of Examples, Comparative example 1 and Comparative example 2 as follows.

PEELING TEST AT BOUNDARY BETWEEN INNER AND OUTER RESINS

The presence or absence of peeling or separation at the boundary surface between the inner and outer resins of test devices was checked by a microscope immediately after the device had been molded. Table 1 below lists the test results for the peeling occurrence rate.

TABLE 1

| | PRINCIPAL WAX COMPONENT | BOUNDARY PEELING OCCURRENCE RATE (%) |
|---|---|---|
| Example | Ester group | 0 |
| | Fatty acid based | 0 |
| | Fatty acid metallic salt based | 0 |
| | Fatty alcohol | 0 |
| | Polyhydric alcohol | 0 |
| | Fatty acid amide | 0 |
| Comparative example 1 | Hydrocarbon | 0 |
| Comparative example 2 | Hydrocarbon | 95 |

CRACK TEST AFTER INFRARED REFLOW SOLDERING

The test devices were kept within a high-temperature and high-humidity vessel for a predetermined time period for saturated moisture absorption. Thereafter, the presence or absence of cracks was checked by a microscope after infrared-reflow soldering for about 10 sec at 240° C. Table 2 below lists the test results for the crack occurrence rate.

TABLE 2

|  | PRINCIPAL WAX COMPONENT | CRACK OCCURRENCE RATE (%) |
|---|---|---|
| Example | Ester | 0 |
|  | Fatty acid | 0 |
|  | Fatty acid metallic salt | 0 |
|  | Fatty alcohol | 0 |
|  | Polyhydric alcohol | 0 |
|  | Fatty acid amide | 0 |
| Comparative example 1 | Hydrocarbon | 0 |
| Comparative example 2 | Hydrocarbon | 99 |

CRACK TEST AFTER DIP SOLDERING

The test devices were kept within a high-temperature and high-humidity vessel for a predetermined time period for saturated moisture absorption. Thereafter, the presence or absence of cracks was checked by a microscope after dip soldering for about 10 sec at 260° C. Table 3 below lists the test results for the crack generation rate.

TABLE 3

|  | PRINCIPAL WAX COMPONENT | CRACK OCCURRENCE RATE (%) |
|---|---|---|
| Example | Ester | 0 |
|  | Fatty acid | 0 |
|  | Fatty acid metallic salt | 0 |
|  | Fatty alcohol | 0 |
|  | Polyhydric alcohol | 0 |
|  | Fatty acid amide | 0 |
| Comparative example 1 | Hydrocarbon | 100 |
| Comparative example 2 | Hydrocarbon | 100 |

MOISTURE RESISTANCE TEST

The test devices were kept within a high-temperature and high-humidity vessel (125° C., 100% RH) for 96 hours. Thereafter, defective devices were checked by measuring electric characteristics thereof. Table 4 below lists the test results for the defective device rate.

TABLE 4

|  | PRINCIPAL WAX COMPONENT | DEFECTIVE DEVICE RATE (%) |
|---|---|---|
| Example | Ester | 0 |
|  | Fatty acid | 0 |
|  | Fatty acid metallic salt | 0 |
|  | Fatty alcohol | 0 |
|  | Polyhydric alcohol | 0 |
|  | Fatty acid amide | 0 |
| Comparative example 1 | Hydrocarbon | 70 |
| Comparative example 2 | Hydrocarbon | 78 |

These test results indicate that there exist no peeling or separation at the boundary surface between the outer and inner resins of the semiconductor devices manufactured in accordance with the method according to the present invention. In addition, there are no cracks after infrared-reflow soldering or dip soldering. In particular, it should be noted that it has been impossible to completely prevent crack generation after dip soldering (see Table 3) in the devices manufactured in accordance with the conventional method, in spite of the fact inner resin treatment has been effected. In the method according to the present invention, it is possible to perfectly prevent crack generation even after dip soldering, thus enabling the adaptation of high-reliable dip soldering in the method of manufacturing the multimold semiconductor devices. Similarly, it has been impossible to ensure the moisture resistance (see Table 4) in the conventional method, even after the inner resin treatment process was effected. In contrast, in the method according to the present invention, it is possible to completely eliminate devices having defective electric characteristics.

What is claimed is:

1. A method of manufacturing semiconductor devices which comprises the following steps of:
   (a) arranging semiconductor chips mounted on a lead frame and bonded with wires in cavities formed in an inner resin mold;
   (b) injecting melted inner resin into an inner resin mold, wax to be added to the inner resin being at least one compound selected from the group consisting of ester group compound, fatty acid based compound, fatty acid metallic salt based compound, fatty alcohol compound, polyhydric alcohol compound, and fatty acid amide compound;
   (c) removing the hardened inner resin sealed semiconductor devices from the inner resin mold;
   (d) arranging the removed inner resin sealed semiconductor devices in cavities formed in an outer resin mold;
   (e) injecting an outer resin into the outer resin mold; and
   (f) removing the hardened outer resin enclosed semiconductor devices from the outer resin mold.

* * * * *